United States Patent
Lee et al.

(10) Patent No.: US 6,867,505 B2
(45) Date of Patent: Mar. 15, 2005

(54) SEMICONDUCTOR DEVICE, A METHOD FOR MAKING THE SAME, AND AN LCD MONITOR COMPRISING THE SAME

(75) Inventors: Chun-Yu Lee, Tainan Hsien (TW); Ping-Chin Cheng, Taipei Hsien (TW)

(73) Assignee: Au Optronics Corp, Hsihchu (TW)

( * ) Notice: Subject to any disclaimer, the term of this patent is extended or adjusted under 35 U.S.C. 154(b) by 3 days.

(21) Appl. No.: 10/010,661

(22) Filed: Nov. 30, 2001

(65) Prior Publication Data

US 2002/0105078 A1 Aug. 8, 2002

(30) Foreign Application Priority Data

Feb. 6, 2001 (TW) .......................................... 90102472 A

(51) Int. Cl.⁷ .......................... H01L 23/48; H01L 23/52; H01L 29/40
(52) U.S. Cl. ......................... 257/783; 257/773; 257/780; 257/781; 257/782; 257/778; 438/119
(58) Field of Search .................. 257/72, 773, 780–783, 257/778, 746, 777, 785; 438/119

(56) References Cited

U.S. PATENT DOCUMENTS

| | | | |
|---|---|---|---|
| 5,650,919 A | 7/1997 | Loh et al. | 361/779 |
| 5,804,882 A | * 9/1998 | Tsukagoshi et al. | 257/783 |
| 5,844,314 A | 12/1998 | Kim | 257/737 |
| 5,903,056 A | 5/1999 | Canning et al. | 257/773 |

* cited by examiner

Primary Examiner—George Eckert
Assistant Examiner—Chris C. Chu
(74) Attorney, Agent, or Firm—Ladas & Parry LLP

(57) ABSTRACT

A semiconductor device, comprising an electrode on a base surface, a bump formed on the electrode, a pad, and a means of connection. The means of connection comprises a plurality of conductive particles, conducting the bump and the pad with conductive particles bonded between. The base surface is further formed with a barrier rib that separates the conductive particles.

21 Claims, 11 Drawing Sheets

SEMICONDUCTOR DEVICE, A METHOD FOR MAKING THE SAME, AND AN LCD MONITOR COMPRISING THE SAME

BACKGROUND OF THE INVENTION

1. Field of the Invention

The present invention relates to a semiconductor device, particularly relates to a semiconductor device using ACF (anisotropic conductive film), a method for making the same, and an LCD monitor comprising the semiconductor device.

2. Description of the Related Arts

In some electric devices, components are connected with anisotropic conductive film, hereinafter referred to as ACF. ACF is comprised of a nonconductive synthetic resin and a plurality of conductive particles mixed therein.

FIG. 1A shows the sectional view of a conductive particle 1. Typically, a conductive particle 1, having a diameter of substantially 3 to 5 $\mu$m, is comprised of a central portion 1a made by some polymers. The outer surface thereof is further coated with a layer of conductive material 1b, such as Au, Ni, Zn, and so on.

ACFs are usually applied in the manufacture of LCD monitors. Sometimes, an ACF is used in connecting the driving chips to the glass substrate of the LCD. Manufacturers refer to this process as COG, i.e., chip on glass. In other cases, an ACF may be applied in connecting the driving chip to a flexible printed circuit (hereinafter referred to as FPC) located on the substrate. This process is referred to as COF.

Additionally, an ACF is also adapted to connect the chip onto a typical printed circuit board, and the process is referred to as COB.

FIG. 1B shows an application of the ACE. In this case, a substrate 4 is formed with some pads 4a, which are provided for transferring plural signals or energy. On the other side, there is a chip 3 comprised of plural electrodes, wherein the electrodes are respectively formed with a bump 3a. The ACF 5 is provided to connect the chip 3 and the substrate 4.

Firstly, the ACF is placed between the two devices, as shown in FIG. 1B. The ACF is heated, reducing the viscosity of the synthetic resin therein. Then, the chip 3 is compressed toward the substrate 4 with the bumps 3a aligned to the corresponding pads 4a.

As shown FIG. 1B, some conductive particles 1 in the ACFs are clipped between the bumps 3a and pads 4a, thereby bumps 3a and the pads 4a are electrically connected by the metal layers 1b on the bumps 3a.

In using the ACF, some common problems may occur. The conductive particles may be improperly shifted as the heated ACF is compressed between the components connected. One problem is shown in FIG. 1C. In the figure, the number of conductive particles 1 clipped by the bumps 3a and the pads 4a is insufficient, and the impedance between the terminals will increase. Another typical problem is shown in FIG. 1D, wherein the conductive particles 1 between two adjacent bumps 3a are highly concentrated, and a short circuit may occur. As microtechnology develops, there is a corresponding increase in the tendency to produce more concentrated chip bumps, with a commensurate increase in the potential for short-circuiting. Addressing the problems, U.S. Pat. No. 5,844,314 provides a structure shown in FIG. 1E. Two ends of the bump 3a are formed with projections 3a1, trapping the conductive particles 1 between the bump 3a and the pad 4a, and maintaining the conductivity of the connecting segment. Additionally, as shown in FIG. 1F, U.S. Pat. No. 5,903,056 provides a method of forming protrusions on the substrate 4 on both sides of the pads 4a, thereby approaching a similar effect to U.S. Pat. No. 5,844,314.

However, U.S. Pat. No. 5,844,314 and U.S. Pat. No. 5,903,056 have not yet solved the problem of short circuits.

As shown in FIG. 1G, U.S. Pat. No. 5,650,919 provides a method to prevent short-circuiting. On the substrate 4, peak-shape dielectric dams 6 are formed between adjacent pads. Thereby, the conductive particles 1 are constrained in predetermined spaces, and short-circuiting can be simultaneously prevented.

However, as shown in FIG. 1H, U.S. Pat. No. 5,650,919 cannot prevent the conductive particles 1 from shifting along the routes indicated by the arrows. In this case, high impedance and short-circuiting are still potential problems. Furthermore, the base 6a of a peak-shape dielectric dam 6 occupies a large space, and may block the bumps in a connection. Therefore, the connection must be aligned rather precisely, and insidiously the manufacturing cost will increase.

Additionally, in the connection, if a misalignment occurs, or a mounted chip is defective, a reworking process is then required to remove the chip from the substrate. The rework may damage the barrier structures, such as the dielectric dam. For the prior arts always form barrier structures on the substrate, if any barrier structure is damaged, the effect of constraining conductive particles 1 will decrease, unless a new set of barrier structures is formed on the substrate. Therefore, a variation for the substrate-based barrier structures in the prior arts is also preferable.

SUMMARY OF THE INVENTION

The present invention is provided to solve the above-mentioned problems.

According to the first aspect of the present invention, this invention provides a LCD monitor, comprising: a circuit device, forming plural electrodes on one side thereof; plural bumps, respectively formed on the electrodes; a substrate, forming plural pads in accordance with the bumps; a connecting means, comprising a plurality of conductive particles, conducting the bumps and the pads with the conductive particles bonded between; and a barrier structure on the side of the circuit device, separating the conductive particles.

The barrier structure is made of an isolating material. The pads include plural first pads and second pads, wherein the first pads are input terminals of the LCD monitor, and the second pads are output terminals of the LCD monitor.

The barrier structure is comprised of a first barrier rib extending along a first direction, forming a partition between the bumps corresponding to the first pads. Additionally, the barrier structure is further comprised of a second barrier rib extending along the first direction, forming a partition between the bumps conducting the second pads. Moreover, the barrier rib is further comprised of a third barrier rib extending along a second direction, forming a partition between the bumps conducting the first and the second pads.

The first and the third barrier ribs are connected, forming an L-shape or T-shape structure. Additionally, the second and the third barrier ribs are connected, forming an L-shape or T-shape structure.

The isolating material is polyimide (PI). The means of connection is an anisotropic conductive film. The bump is made of one metal selected from the group consisting of Au, Cu, Ni, and Zn. The substrate is made of glass.

The circuit device may be an integrated circuit or a flexible printed circuit (FPC).

According to the second aspect of the present invention, this invention provides a semiconductor device, comprising: an electrode forming on a base surface; a bump forming on the electrode; a pad; a connecting means, comprising a plurality of conductive particles, conducting the bump and the pad with the conductive particles bonded between; and a barrier rib forming on the base surface, separating the conductive particles.

The barrier rib is made by an isolating material; the pad is further comprised of plural first pads and second pads, wherein the first pads are input terminals of the LCD monitor, and the second pads are output terminals of the LCD monitor; the barrier rib is further comprised of a first barrier rib extending along a first direction, separating the conductive particles between the first pads; the barrier rib is further comprised of a second barrier rib extending along the first direction, separating the conductive particles between the second pads; and the barrier rib is further comprised of a third barrier rib extending along a second direction, separating the conductive particles between the first and the second pads.

The first and the second barrier rib are respectively connected to the third barrier rib, forming an L-shape structure. The first and the second barrier ribs are respectively connected to the third barrier rib, forming a T-shape structure. Additionally, The isolating material is polyimide; the connecting means is an anisotropic conductive film; and the bump is made of one metal selected from the group consisting of AU, Cu, Ni, and Zn.

According to the third aspect of the present invention, this invention provides a method for making a semiconductor device, comprising the steps of: providing a circuit device, wherein the circuit device is formed with plural electrodes on one side thereof; forming a protective layer on the side of the circuit device with the electrodes exposed; forming plural bumps on the protective layer in accordance with the electrodes, and conducting the electrodes and the bumps; and forming plural barrier ribs on the side of the circuit device, separating the bumps.

BRIEF DESCRIPTION OF THE DRAWINGS

The present invention can be fully understood from the following detailed description and preferred embodiment with reference to the accompanying drawings in which:

FIGS. 7 and 8 show applications of a semiconductor device according to the present invention.

DETAIL DESCRIPTION OF THE EMBODIMENT

The semiconductor device used to describe the present invention is a LCD monitor.

The First Embodiment

Figure 1A:
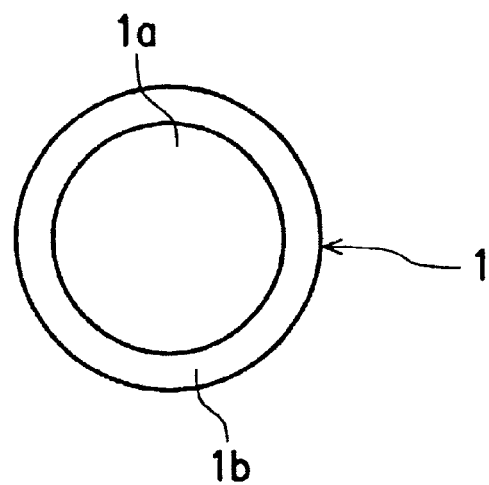
FIG. 1A shows the conventional structure of a conductive particle.
Figure 1B:
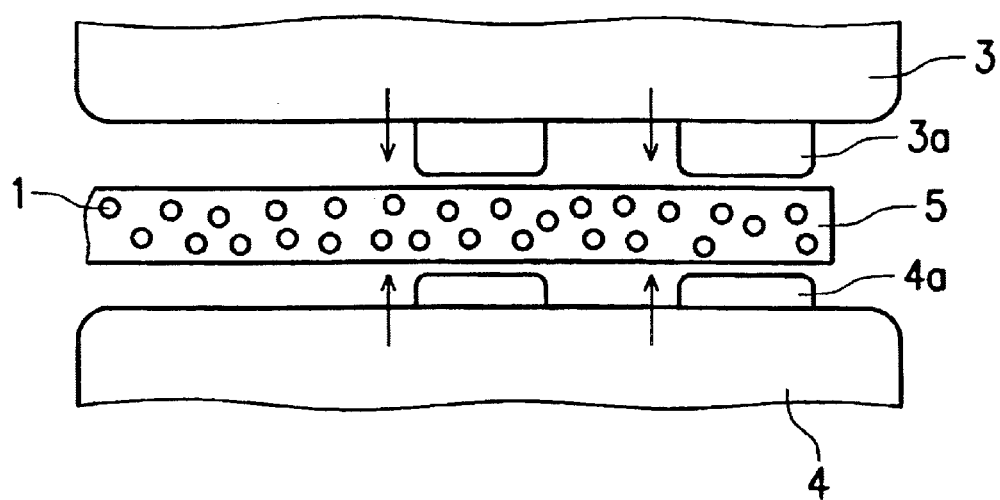
FIG. 1B shows the assembly, whereby the driver chip and the glass substrate are assembled with an ACF.
Figure 1C:
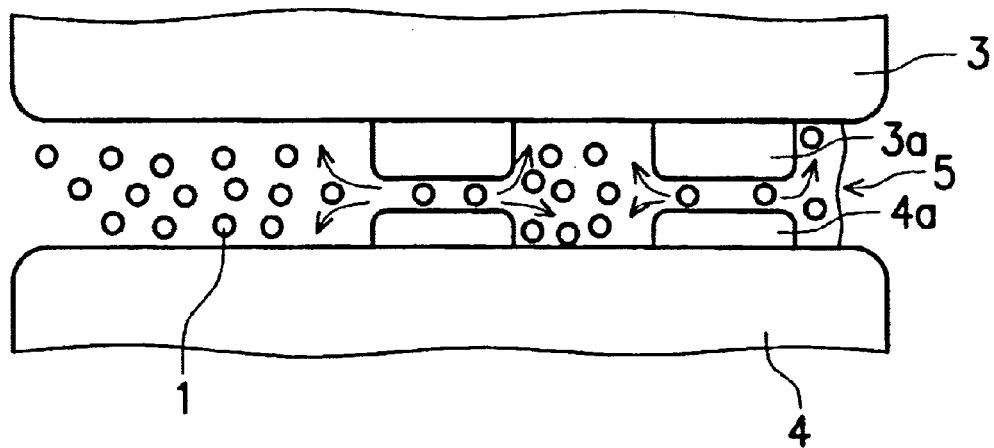
FIGS. 1C and 1D show common problems in the conventional assembly using ACF.
Figure 1D:
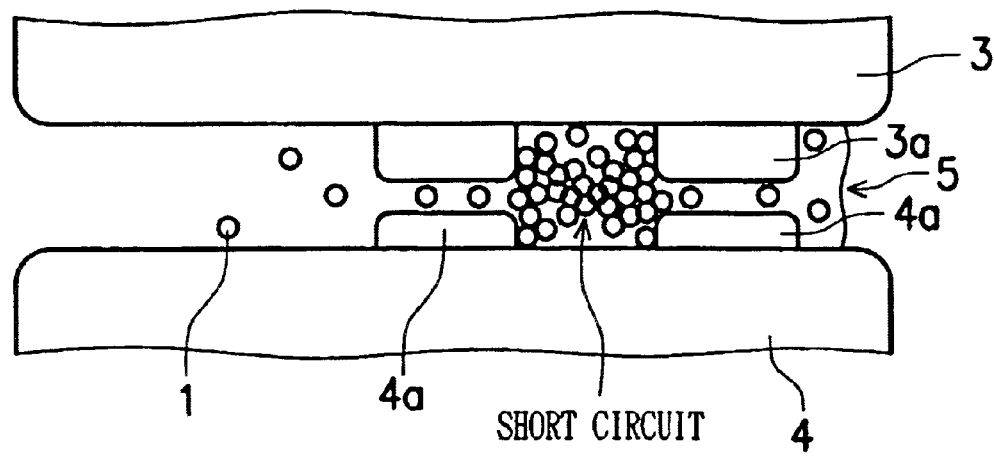
Figure 1E:
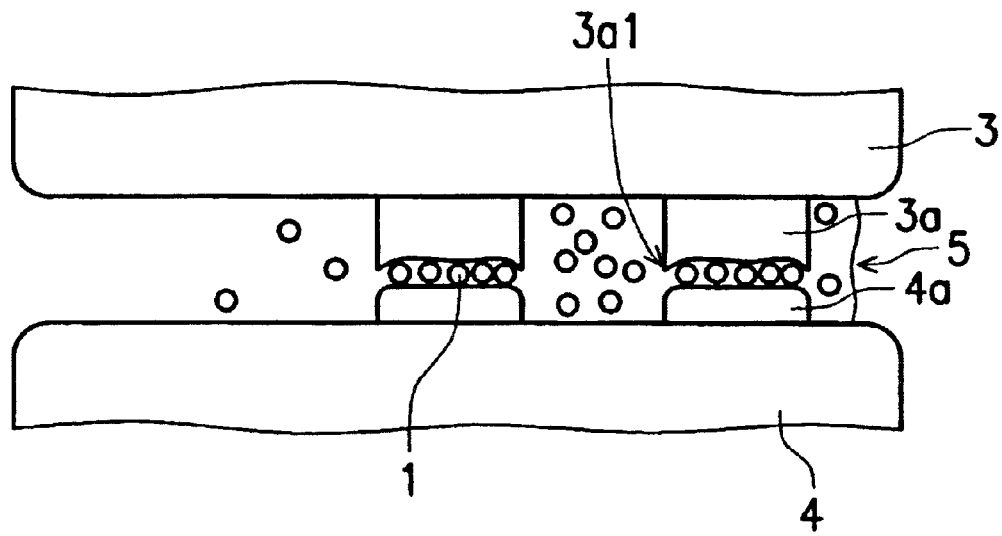
FIGS. 1E to 1G show several structures in the prior arts for solving the assembly problems.
Figure 1F:
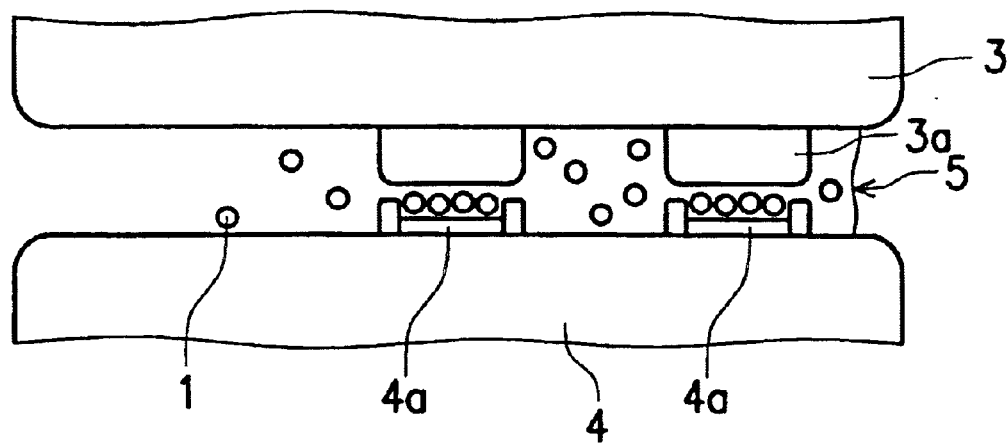
Figure 1G:
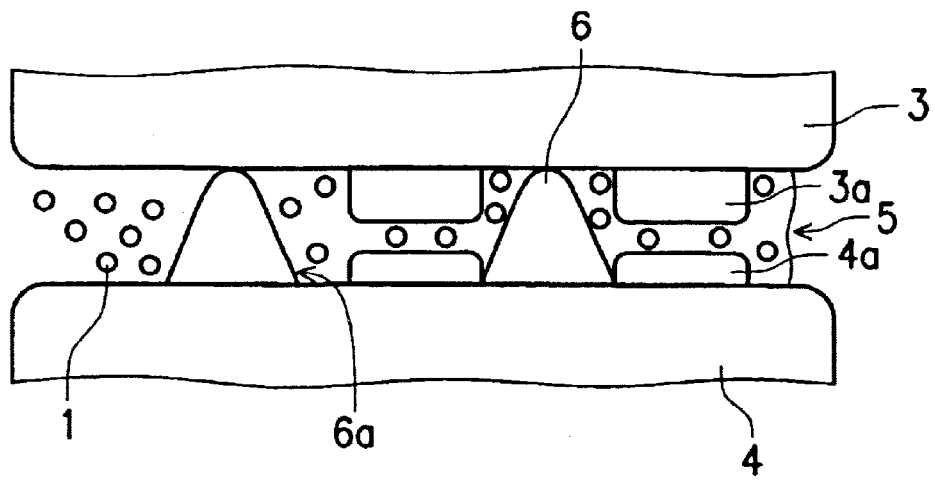
Figure 1H:
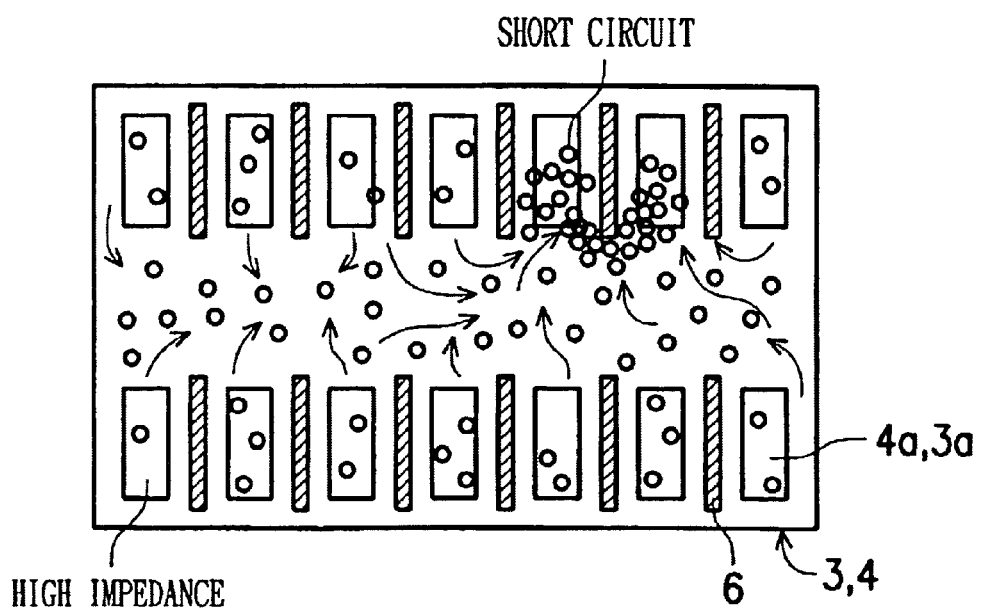
FIG. 1H shows a still-existent problem in the prior arts.
Figure 2:
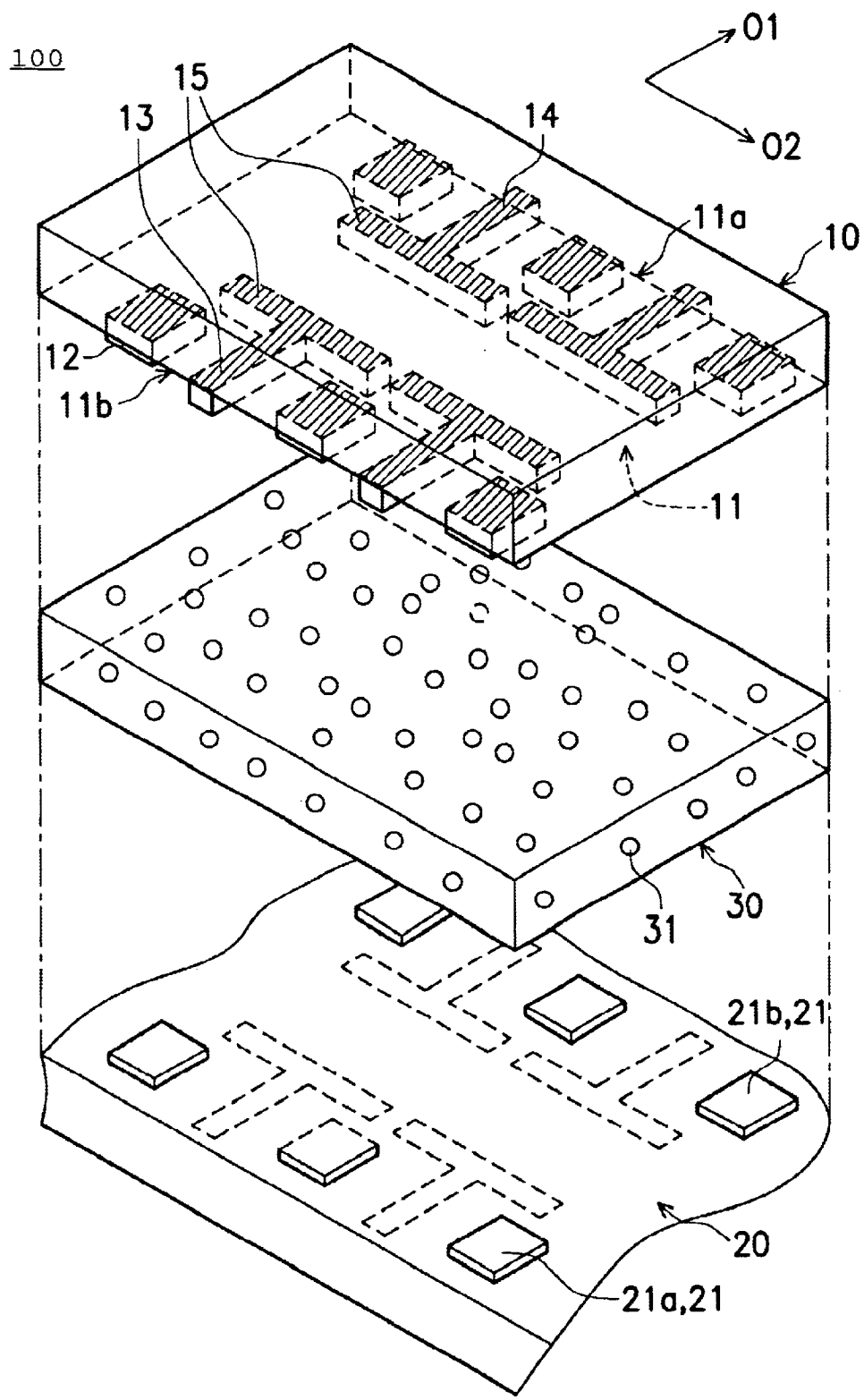
FIG. 2 shows a partial structure of an LCD monitor according to the embodiment the present invention.

In FIG. 2, there is a LCD monitor 100 according to the first embodiment of the present invention. The LCD 100 is comprised of plural circuit devices, which are preferably driving chips 10 (for conciseness, only one is shown). Each of the chips 10 is formed with plural bumps 12 on areas near the two edges 11a, 11b of a base surface 11 thereon. The bumps 12 are made of a kind of metal, such as Au, Cu, Ni, Zn and so on.

Substrate 20 is the glass substrate of the LCD monitor 100, comprising plural pads 21 for signal (or power) transfer. The pads 21 are formed on locations in accordance to the bumps 12.

The connecting means 30, preferably an ACF 30, is provided for electrically connecting the chips 10 to the substrate 20 by a plurality of conductive particles 31 mixed within. In connection, the conductive particles 31 are clipped between the pads 21 and bumps 12 on the substrate 20, thereby conducting the two terminals.

The pads 21 include plural first pads 21a and second pads 21b, wherein the first pads 21a are input terminals of the LCD 100, and the second pad 21b are output terminals of the LCD 100. Significantly, in the design of the present invention, there are plural barrier ribs formed on one chip 10. These barrier ribs are formed to separate the conductive particles 31, thereby preventing the improper shifting of the conductive particles 31. The barrier ribs are made from isolating material, such as polyimide (PI). The barrier ribs include plural first barrier ribs 13, second barrier ribs 14, and third barrier ribs 15. In FIG. 2, the first barrier ribs 13 extend along a first direction O1, thereby forming separations between the bumps 12 conducting to the first pads 21a; the second barrier ribs 14 extend along also the first direction O1, thereby forming separations between the bumps 12 conducting to the second pads 21b; and the third barrier ribs 15 extend along a second direction O2, thereby separating the bumps 12 conducting to the first pads 21a from that conducting to the second pad 21b.

As shown in FIG. 2, the first and second barrier ribs 13, 14 may connect to the adjacent third barrier ribs 15, forming L-shaped structures (not shown) or T-shaped ones (as shown in the figure)

Figure 3:
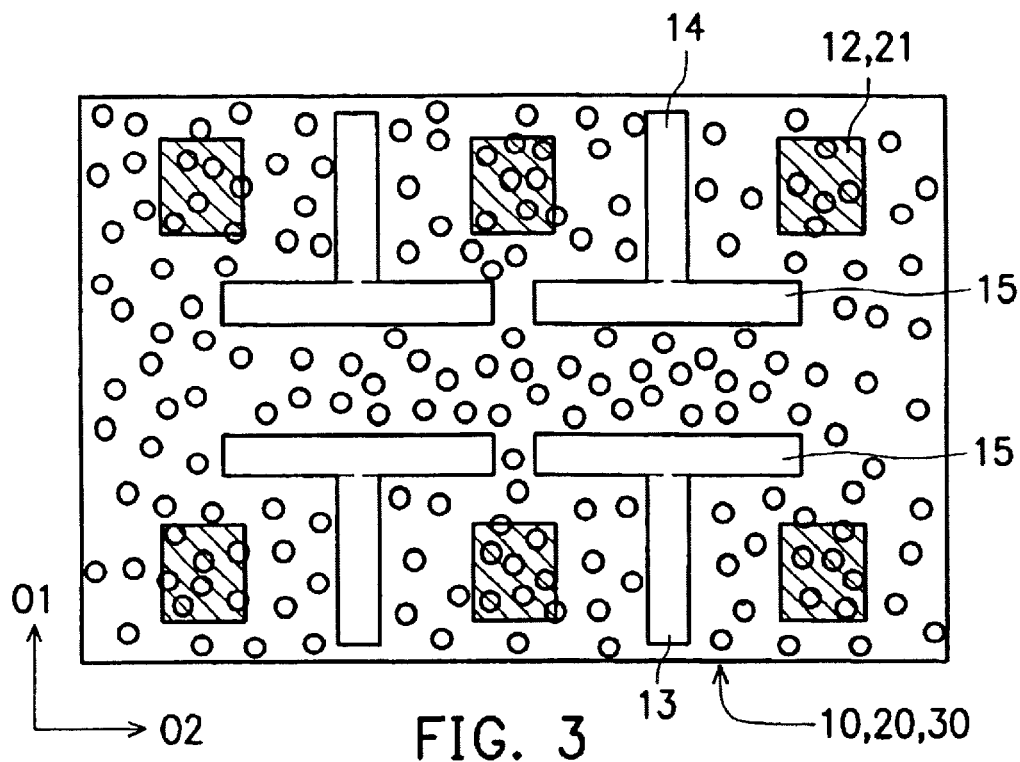
FIG. 3 shows an arrangement for the barrier ribs on a chip in the embodiment of the present invention.

According to the first embodiment of the present invention, as shown in FIG. 3, there are plural third barrier ribs 15 forming along the central region of the chip 10, and the first and second barrier rib 13, 14 are one-to-one connected to the adjacent third barrier rib 15.

The Second Embodiment

Figure 4:
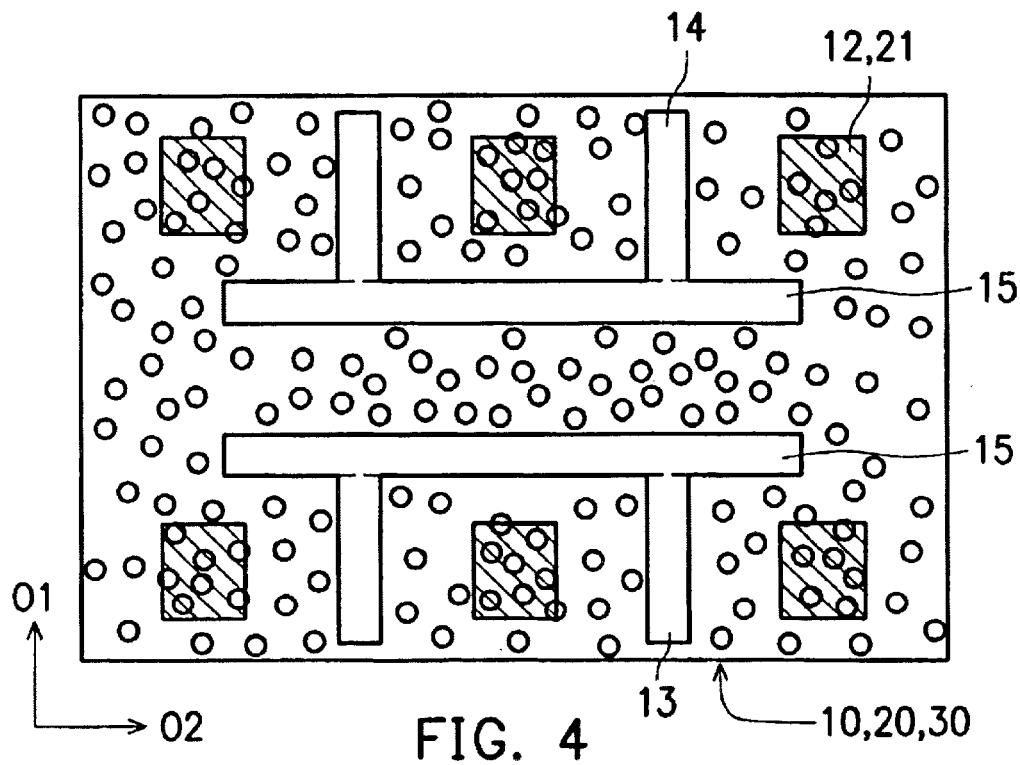
FIG. 4 shows another arrangement for the barrier ribs on a chip in the embodiment of the present invention.

According to the second embodiment of the present invention, as shown in FIG. 4, there are only two third barrier ribs 15 forming along the central region of the chip 10, parallel to each other. The first and second barrier ribs 13, 14 are connected to the adjacent third barrier ribs 15.

According to the first and second embodiments, with these constructions, the problems mentioned above can be effectively prevented.

Figure 5A:
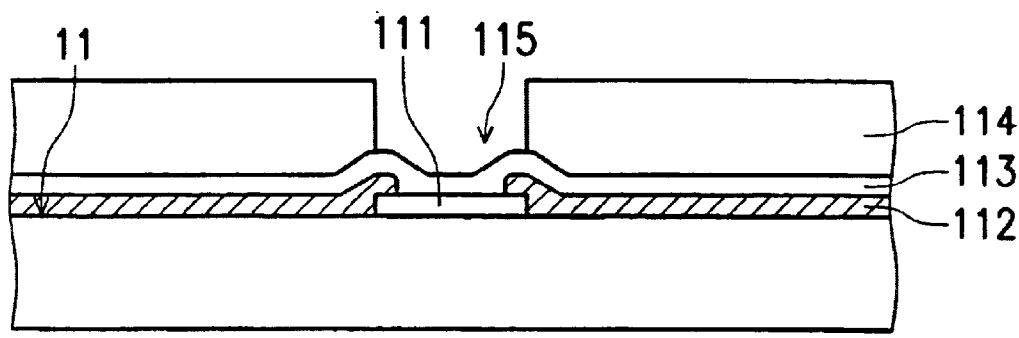
FIGS. 5a to 5c show the conventional procedures to form the bumps on a chip.
Figure 5B:
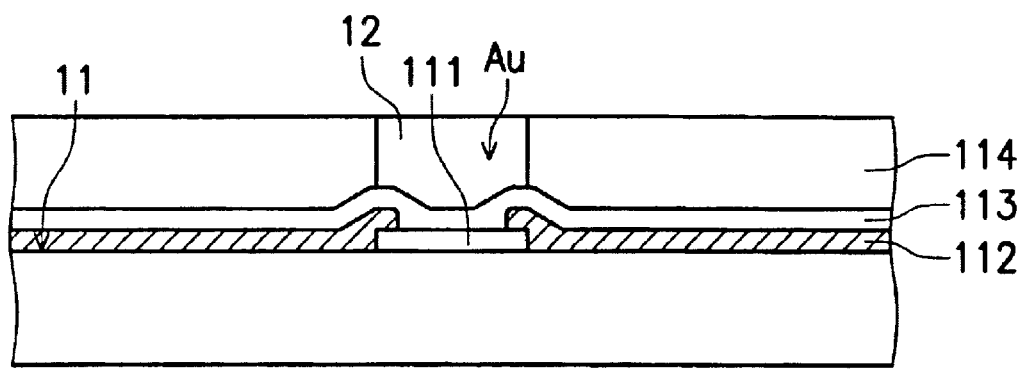
Figure 5C:
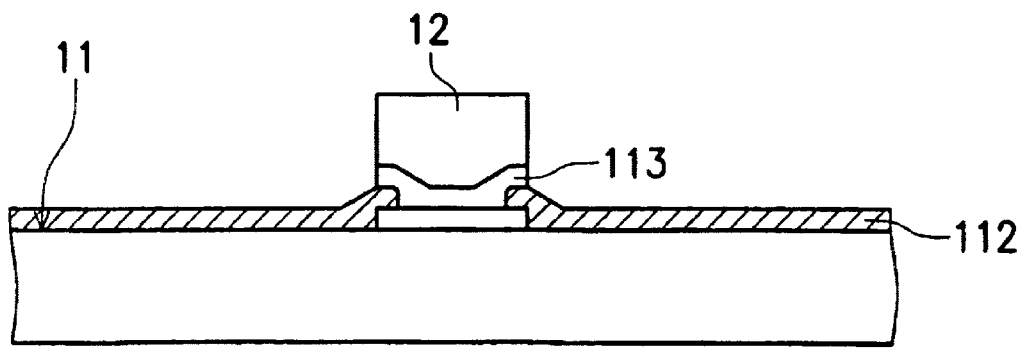

On the other hand, in the aspect of manufacturing, it is preferable that the barrier ribs 13, 14, 15 of the present invention are formed during the manufacturing processes of the chip 10. A bumps-forming method provided in the present invention is described FIGS. 5a to 5c shows conventional processes to form the bumps on a chip. As shown in FIG. 5a, a passivation (protective) layer 112 is firstly formed on a circuit device (an IC) except the electrode 111 of the IC. Secondly, a metal layer 113 is formed by using Ti or W. A photoresistant layer 114 is then disposed over the metal layer 113, with the exception of an area 115 for forming a bump 12 immediately above the electrode. After that, in FIG. 5b, a gold layer (Au) is electrodeposited in the area 115 to form the bump 12. Finally, in FIG. 5c, the photoresistant layer 114 and a large portion of the metal layer 113 are removed, leaving the golden bump supported by a section of the metal layer 113 and the electrode 111.

To form predetermined barrier structures on the base surface 11 of the chip 10, the present invention provides some improvement to the bumps-forming procedures. The forming processes of the present invention are shown in FIGS. 6a to 6g.

Figure 6A:
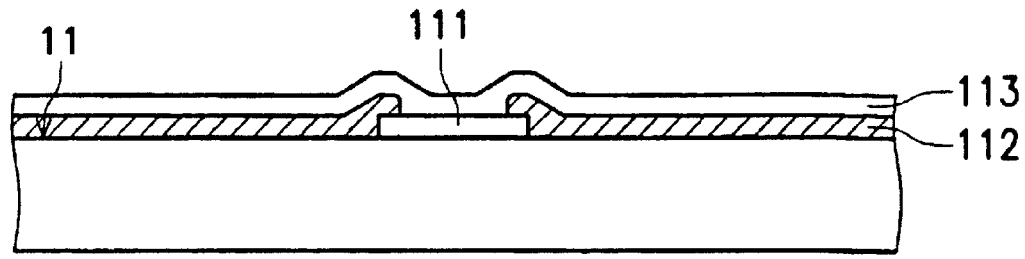
FIGS. 6a to 6g show the procedures to form the barrier ribs of the present invention on a chip.
Figure 6B:
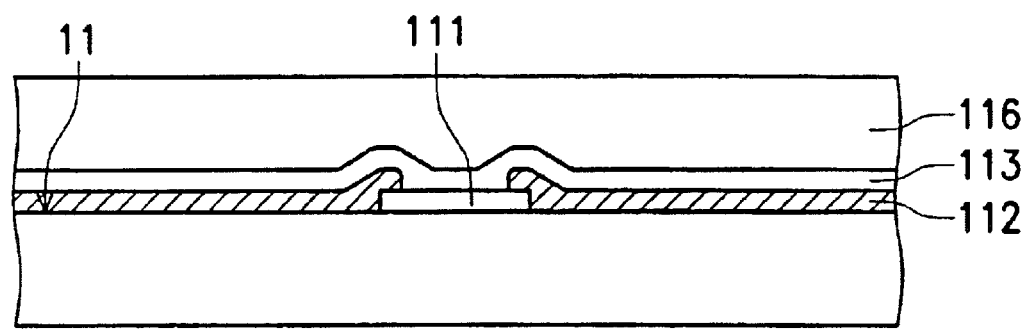
Figure 6C:
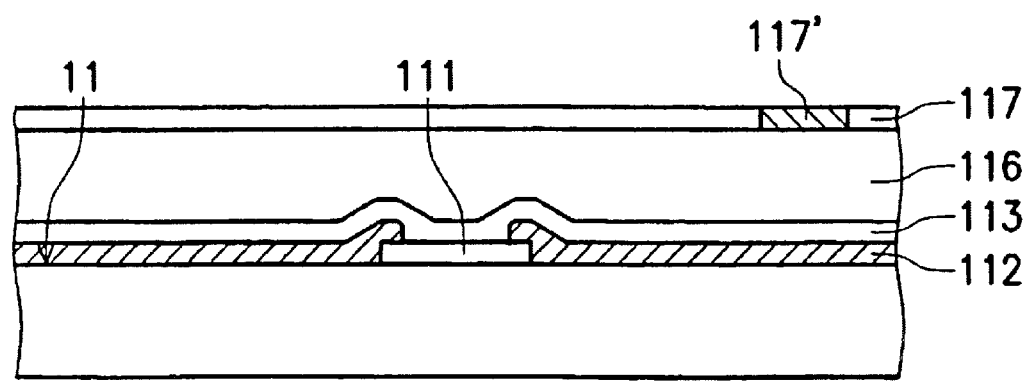
Figure 6D:
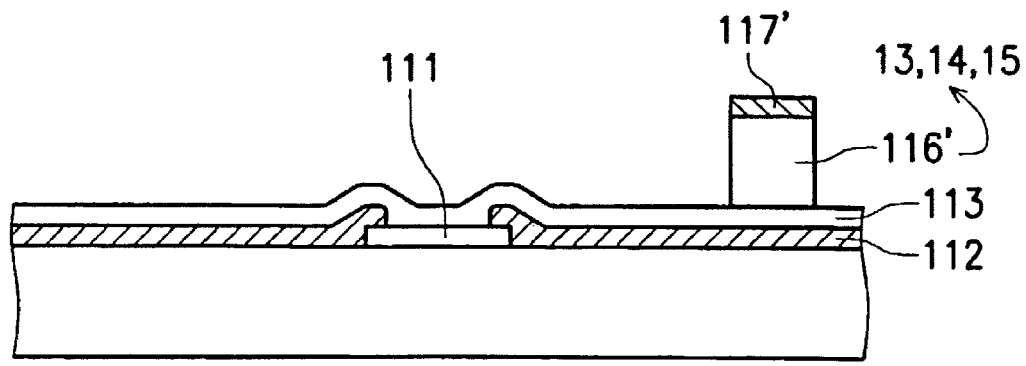

In FIG. 6a, a passivation layer 112 is firstly formed on a base surface 11 of the IC except the electrode 111. A metal layer 113 is then formed upon the passivation layer 112. After that, in FIG. 6b, the metal layer 113 is disposed with a polymer layer, which is preferably PI (polyimide) layer 116. A photoresistant layer 117 is then disposed over the PI layer 116, as shown in FIG. 6c. According to proper mask processes (not shown), as shown in FIG. 6d, most of the photoresistant layer 117 and the PI layer 116 are removed, leaving a section of the PI layer 116' covered by the photoresistant layer 117'. The PI layer 116' left is just one of the barrier ribs required.

Figure 6E:
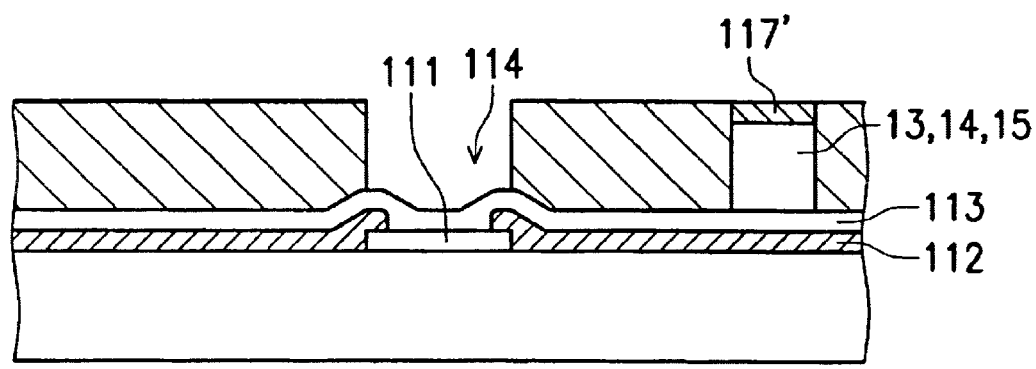
Figure 6F:
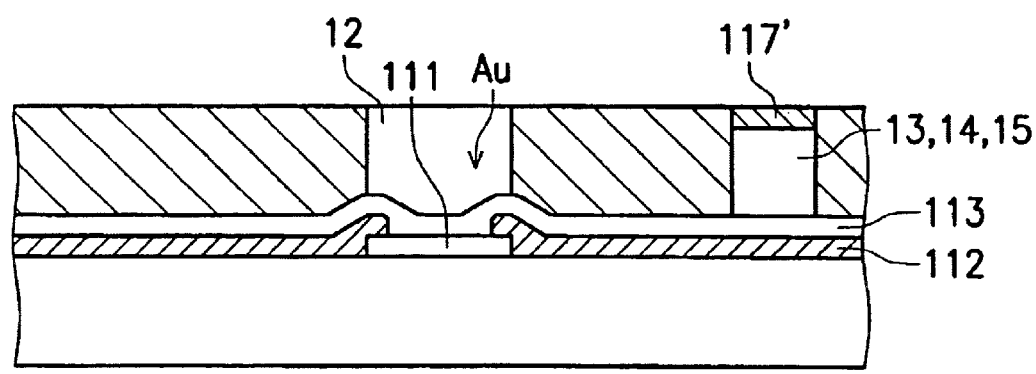
Figure 6G:
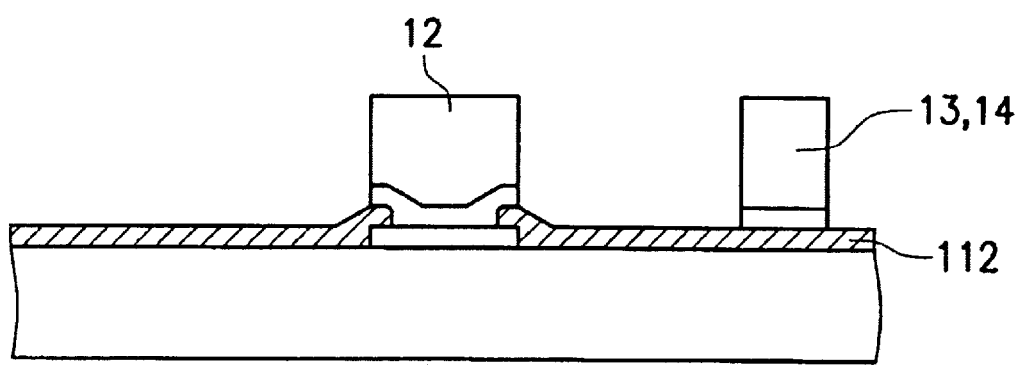

After that, the procedures listed in FIGS. 6e to 6g are executed by simply repeating the procedures corresponding to FIGS. 5a to 5c. Finally, on the chip, a bump 12 is formed along with the barrier ribs 13, 14, and 15.

Figure 7:
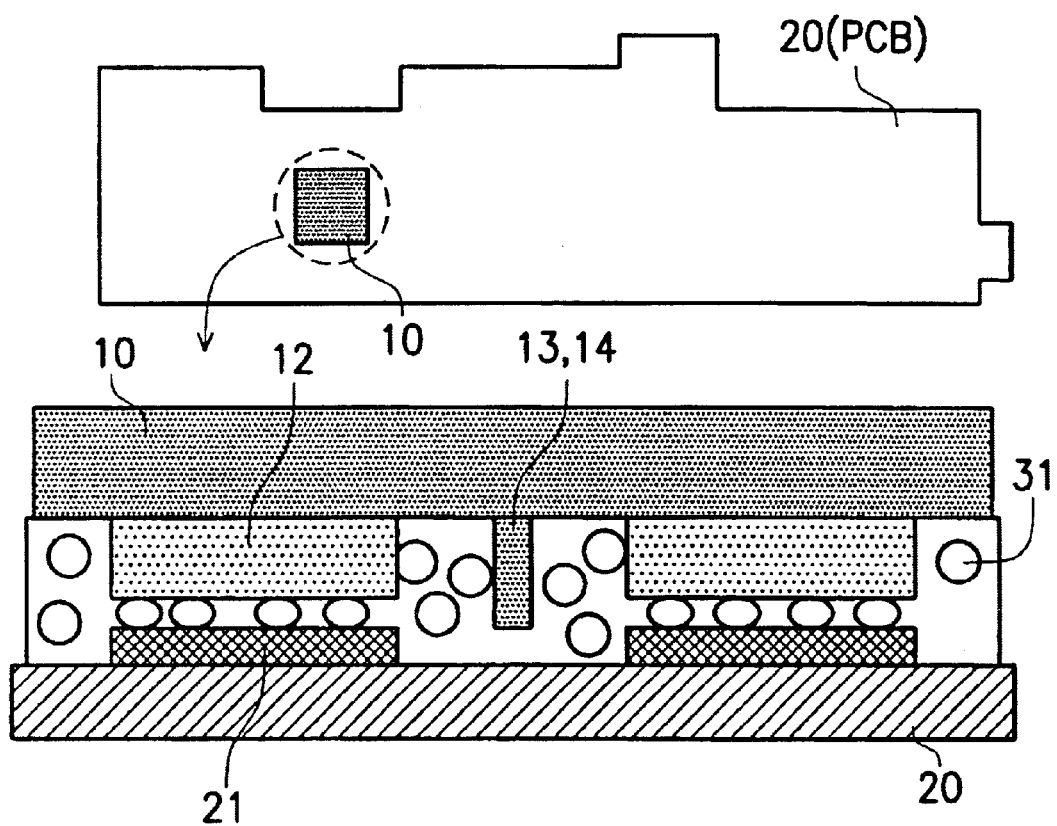

In addition to the COG processes for making LCD in above embodiments, the semiconductor device of the present invention can be further used in other ways, such as: COP processes as shown in FIG. 7, wherein the substrate 20 is a PCB (printed circuit board); and COF processes as shown in FIG. 8, wherein the substrate 20 is a FPC (flexible printed circuit).

According to the present invention, in manufacturing electric devices using ACF, the improper shifting of conductive particles can be effectively prevented, thereby maintaining the conducting qualities of products. Additionally, the barrier ribs provided in the present invention are chip-based structures, so that the ribs and can be simultaneously form in chip manufacturing processes rather than forming separately on a LCD substrate, or other substrates conventionally used. Thereby, productivities and yielding rates can be improved. Furthermore, if a mounted circuit device (chip) is defective, because the barrier ribs are formed on the circuit device, the manufacturer can easily remove the chip without damaging the ribs, thereby saving the cost of reworking.

While the invention has been described with reference to a preferred embodiment, the description is not intended to be construed in a limiting sense. It is therefore contemplated that the appended claims will cover any such modifications or embodiments as may fall within the scope of the invention defined by the following claims and their equivalents.

What is claimed is:

1. An LCD monitor, comprising:
   a circuit device, having plural electrodes on one side thereof;
   plural bumps, respectively disposed on the electrodes;
   a substrate, having plural first pads and plural second pads in accordance with the bumps;
   a means of connection, comprising a plurality of conductive particles, conducting the bumps and the pads with the conductive particles bonded between; and
   a barrier structure disposed on the side of the circuit device, the barrier structure being higher than the bumps without contacting the substrate to separate the conductive particles, wherein the barrier structure comprises a plurality of first barrier ribs extending along a first direction to form a partition between the bumps corresponding to the first pads, a plurality of second barrier ribs extending along the first direction to form a partition between the bumps corresponding to the second pads and a plurality of third barrier ribs extending along a second direction to form a partition between the bumps corresponding to the first and the second pads.

2. The LCD monitor of claim 1, wherein the barrier structure is made by an isolating material.

3. The LCD monitor of claim 2, wherein the first pads are input terminals of the LCD monitor, and the second pads are output terminals of the LCD monitor.

4. The LCD monitor of claim 2, wherein the isolating material is polyimide (PI).

5. The LCD monitor of claim 2, wherein the connecting means is an anisotropic conductive film.

6. The LCD monitor of claim 2, wherein the bump is made of one metal selected from the group consisting of Au, Cu, Ni, and Zn.

7. The LCD monitor of claim 2, wherein the substrate is made by glass.

8. The LCD monitor of claim 2, wherein the circuit device is an integrated circuit.

9. The LCD monitor of claim 2, wherein the circuit device is a flexible printed circuit.

10. The LCD monitor of claim 1, wherein the first and the third barrier ribs are connected, having a plurality of L-shaped structures.

11. The LCD monitor of claim 1, wherein the first and the third barrier ribs are connected, having a plurality of separated T-shaped structures.

12. The LCD monitor of claim 1, wherein the second and the third barrier ribs are connected, whereby having a plurality of L-shape structures.

13. The LCD monitor of claim 1, wherein the second and the third barrier ribs are connected, having a plurality of separated T-shaped structure.

14. The LCD monitor of claim 1, wherein the first barrier ribs are perpendicular to the third barrier ribs.

15. The LCD monitor of claim 1, wherein the first barrier ribs are parallel to the third barrier ribs.

16. A semiconductor device, comprising:
   an electrode disposed on a base surface;
   a bump disposed on the electrode;
   a pad comprising plural first pads and second pads;
   a connecting means, comprising a plurality of conductive particles, whereby conducting the bump and the pad with the conductive particles bonded between; and
   a barrier rib disposed on the base surface, the barrier rib being higher than the bumps to separate the conductive particles, wherein the barrier rib comprises a plurality of first barrier ribs extending along a first direction to separate the conductive particles between the first pads, a plurality of second barrier ribs extending along the first direction to separate the conductive particles between the second pads and a plurality of third barrier ribs extending along a second direction, separating the conductive particles between the first and the second pads.

17. The semiconductor device of claim 16, wherein the barrier rib is made by an isolating material;

the first pads are input terminals of a LCD monitor, and the second pads are output terminals of the LCD monitor.

18. The semiconductor device of claim 17, wherein the first and the second barrier rib are respectively connected to the third barrier rib, having a plurality of L-shaped structures.

19. The semiconductor device of claim 17, wherein the first and the second barrier ribs are respectively connected to the third barrier rib, having a plurality of separated T-shaped structures.

20. The semiconductor device of claim 17, wherein the isolating material is polyimide;

the connecting means is an anisotropic conductive film; and the bump is made by one metal selected from the group consisting of AU, Cu, Ni, and Zn.

21. A method for making a semiconductor device, comprising the steps of:

providing a circuit device, wherein the circuit device is formed with plural electrodes on one side thereof;

forming a protective layer on the side of the circuit device with the electrodes exposed;

forming plural bumps on the protective layer in accordance with the electrodes, and conducting the electrodes and the bumps; and forming a plurality of first, second and third barrier ribs on the side of the circuit device, thereby separating the bumps, wherein the barrier ribs are higher than the bumps.

* * * * *